United States Patent [19]
Fujii

[11] Patent Number: 5,478,775
[45] Date of Patent: Dec. 26, 1995

[54] RIDGE STRIPE TYPE LASER DIODE AND METHOD FOR FABRICATING THE SAME

[75] Inventor: Hiroaki Fujii, Tokyo, Japan

[73] Assignee: NEC Corporation, Tokyo, Japan

[21] Appl. No.: 350,886

[22] Filed: Dec. 7, 1994

[30] Foreign Application Priority Data

Dec. 10, 1993 [JP] Japan ................... 5-341316

[51] Int. Cl.$^6$ .................................. H01L 21/20
[52] U.S. Cl. ................... 437/129; 148/DIG. 95
[58] Field of Search ............... 437/129; 148/DIG. 95

[56] References Cited

U.S. PATENT DOCUMENTS

| | | | |
|---|---|---|---|
| 4,147,571 | 4/1979 | Stringfellow et al. | 117/104 |
| 4,213,805 | 7/1980 | Tsukada | 437/129 |
| 4,569,721 | 2/1986 | Hayakawa et al. | 437/129 |
| 5,053,356 | 10/1991 | Mitsui et al. | 437/129 |
| 5,173,447 | 12/1992 | Ijichi et al. | 437/129 |
| 5,268,328 | 12/1993 | Mori et al. | 437/129 |
| 5,282,218 | 1/1994 | Okajima et al. | 372/46 |
| 5,355,384 | 10/1994 | Inoue et al. | 372/46 |
| 5,395,792 | 3/1995 | Ikawa et al. | 148/DIG. 95 |

FOREIGN PATENT DOCUMENTS

| | | | |
|---|---|---|---|
| 58231 | 8/1982 | European Pat. Off. | 437/129 |
| 177493 | 7/1988 | Japan . | |

OTHER PUBLICATIONS

"632.7 nm CW Operation (20° C.) of AlGaInP Visible Laser Diodes Fabricated on (001) 6° Off Toward [110] GaAs Substrate," Kenichi Kobayashi et al., Japanese Journal of Applied Physics, vol. 29, No. 9, Sep. 1990, pp. L1669–L1671.

"Stable 30mW Operation at 50° C. for Strained MQW AlGaLnP Visible Laser Diodes," Y. Ueno et al., Electronics Letters, vol. 28, No. 9, Apr. 23, 1992, pp. 860–861.

"Novel Selective Area Growth of AlGaAs and AlAs with HCl Gas by MOVPE," K. Shimoyama et al., Journal of Crystal Growth 124, 1992, pp. 235–242.

Primary Examiner—R. Bruce Breneman
Assistant Examiner—Linda J. Fleck
Attorney, Agent, or Firm—Popham, Haik, Schnobrich & Kaufman, Ltd.

[57] ABSTRACT

A semiconductor laser diode of a ridge type includes a double heterostructure in which a cladding layer is formed in a mesa stripe form and a current block layer which selectively buries mesa side and bottom surfaces of the cladding layer. For fabrication, a first step is to grow, sequentially above a substrate, a second cladding layer, an active layer, a first cladding layer and a cap layer. A second step is to etch the first cladding layer and the cap layer respectively in mesa stripe forms. A third step is to selectively grow current blocking layer on the first cladding layer by a metalorganic vapor phase epitaxy process. A fourth step is to grow contact layers respectively on surfaces of the current blocking layer and the cap layer. In the third step, a gas in which HCl is mixed in a concentration within a range of 0.2~2 in a (HCl)/(III gas) ratio is used, which enhances re-evaporation of material on a selective mask. Thus, the protrusion formed in the current blocking layer at each of the mesa side surfaces can be suppressed to a thickness not larger than 10% of a thickness of the current blocking layer at its flat portion. In this way, the stress caused by lattice mismatch at the mesa side portions can be suppressed.

4 Claims, 3 Drawing Sheets

FIG. IA PRIOR ART
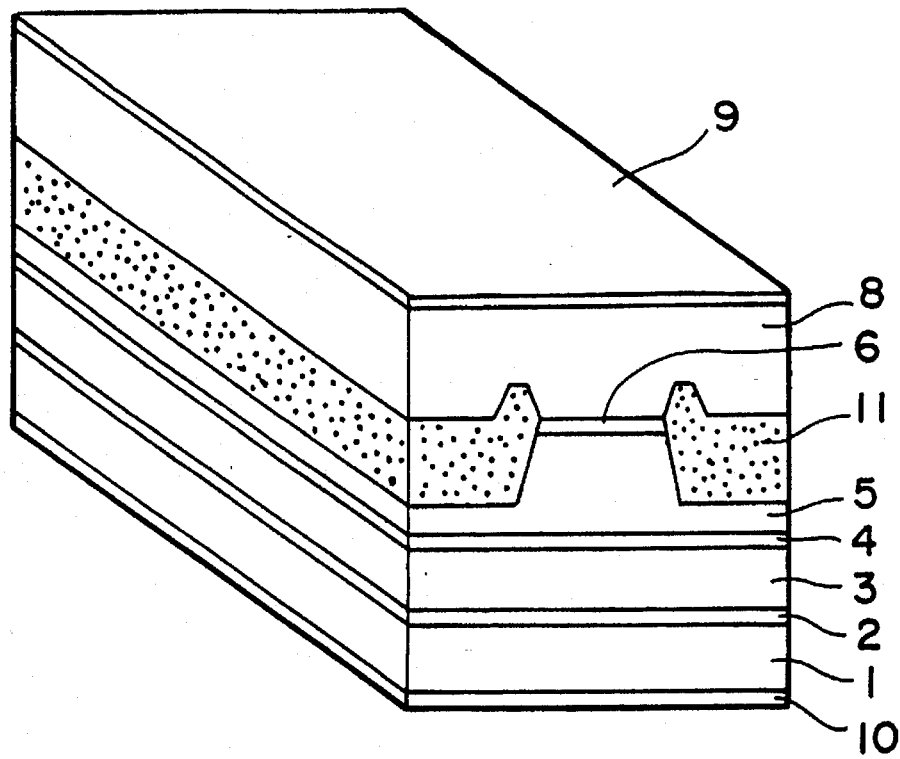
FIG. IB PRIOR ART
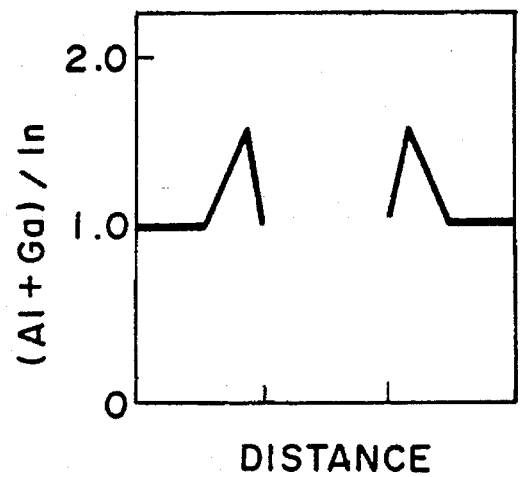

DISTANCE

RIDGE STRIPE TYPE LASER DIODE AND METHOD FOR FABRICATING THE SAME

BACKGROUND OF THE INVENTION (1) Field of the Invention

The present invention relates to a semiconductor laser diode, and more particularly to a ridge stripe type laser diode and a method for fabricating the same.

(2) Description of the Related Art

In recent years, extensive researches are in progress for attaining a higher output power and a shorter lasing wavelength in a semiconductor visible laser diode which uses GaInP or AlGaInP in the light emitting layer. An example of a laser diode which can reliably operate at more than 30 mW at 50° C. has been reported in Electronics Letters, Vol. 28, No. 9 pp. 860–861, 1992. Also, an example of a short wavelength laser diode, wherein 632.7 nm cw operation was achieved at 20° C., has been reported in Japanese Journal of Applied Physics (JJAP), Vol. 29, No. 9, pp. L1669–1671, 1990.

Each of the forgoing semiconductor visible laser diodes using AlGaInP layers as light emitting layers employs a structure wherein a ridged waveguide is selectively buried in a GaAs current blocking layer, and this GaAs current blocking layer causes a large absorption loss to occur with respect to an optical waveguide. This absorption loss presents a great obstacle to the achievement of low threshold currents and high-performance of semiconductor laser diodes. The inventor in the present application has experimented the use of an AlGaInP layer, which is transparent to oscillating wavelengths, in place of a GaAs layer for the current blocking layer described above.

FIG. 1A is a diagram showing a perspective view of a conventional semiconductor laser diode, and FIG. 1B shows a composition ratio of (Al+Ga)/In contained in a current blocking layer. As shown in FIG. 1A, the current blocking layer 11 is constituted by n-AlGaInP. Further, in this semiconductor laser diode, a multiquantum-well (MQW) active layer 4 is sandwiched between an upper AlGaInP cladding layer 5 and a lower AlGaInP cladding layer 3, and there are provided a double heterostructure in which the upper cladding layer 5 is formed in a mesa stripe shape and a current blocking layer 11 which selectively buries the mesa side and bottom surfaces of the upper cladding layer 5. In the drawings, the numeral 1 depicts an n-GaAs substrate, 2 depicts an n-GaAs buffer layer, 6 depicts a p-GaInP cap layer, 8 depicts a p-GaAs contact layer, 9 depicts a p-electrode and 10 depicts an n-electrode.

In the foregoing conventional semiconductor laser diode, after the cap layer 6 and the cladding layer 5 are shaped into the mesa stripe form by etching, the current blocking layer 11 of n-AlGaInP is selectively grown by an ordinary metalorganic vapor phase epitaxy method (MOVPE) without hydrogen chloride (HCl) being added.

On the other hand, as a method for selectively etching an AlGaAs layer of a material system which also includes aluminum (Al), an AlGaAs selective growth method using HCl is known. This has been disclosed by researchers of Mitsubishi Kasei Corp. in Journal of Crystal Growth, Vol. 124, pp. 235–242, 1992. This method is intended to enhance the degree of selective growth of AlGaAs by adding HCl in carrying out the MOVPE process.

However, in the conventional semiconductor laser diode shown in FIG. 1A, there is a problem in that, when the (Al+Ga)/In composition ratio in the current blocking layer 11 of the n-AlGaInP is measured by EDX (Energy Dispersive X-ray Analysis), the ratio greatly deviates from "1" at side portions of the mesa as seen in FIG. 1B. For the AlGaInP material to be lattice-mismatched with respect to the GaAs of the substrate 1, it is required that the (Al+Ga)/In composition ratio be "1". Thus, the fact that there is a large deviation from "1" in the composition ratio means that there is a large stress introduced to the sides of the mesa as a result of the lattice-mismatching.

The reason why the composition ratio deviation occurs at the sides of the mesa is thought to be probably due to diffusion coefficient differences in various materials on a selective mask. It is thought that, on the selective mask, the diffusion coefficient of each of the Al and Ga source materials is larger than that of the In source material, resulting in a large deviation of the (Al+Ga)/In composition ratio from "1" at the mesa side portions.

The composition ratio deviation explained above has a good correlation with protrusions in the current blocking layer that are formed at the sides of the mesa as seen in FIG. 1A. The material on the selective mask diffuses at the mesa side portions during the growth and the protrusions result from an increased growth rate thereof at the mesa side portions as compared with that at the flat portion.

SUMMARY OF THE INVENTION

An object of the present invention, therefore, is to overcome the problem existing in the prior art and to provide a ridged type semiconductor laser diode and a method for fabricating the same, which is made highly reliable due to the reduction of stresses at mesa side portions caused by a composition ratio deviation in a current blocking layer.

According to one aspect of the invention, there is provided a semiconductor laser diode having:

an active layer;

a first and a second cladding layer sandwiching the active layer, the second cladding layer being in a double heterostructure formed in a mesa stripe form;

a current blocking layer which is disposed at a side opposite from a substrate with respect to the active layer and which selectively buries mesa side and bottom surfaces of the first cladding layer, the semiconductor laser diode being characterized in that a protrusion formed in the current blocking layer at each of the mesa side surfaces has a thickness not larger than 10% of a thickness of the current blocking layer at its flat portion.

According to another aspect of the invention, there is also provided a method for fabricating a semiconductor laser diode, the method comprising the steps of:

a first step of growing, sequentially above a substrate, a second cladding layer, an active layer, a first cladding layer and a cap layer;

a second step of etching the first cladding layer and the cap layer respectively in mesa stripe forms;

a third step of selectively growing a current blocking layer on the first cladding layer by a metalorganic vapor phase epitaxy process; and a fourth step of growing contact layers respectively on surfaces of the current blocking layer and the cap layer, the method being characterized in that the third step of selective growth is carried out by using a gas in which HCl is mixed in a concentration within a range of 0.2~2 in a (HCl)/(III gas) ratio.

As explained above, in the conventional semiconductor laser diode, it is thought that the composition ratio deviation occurs at the sides of the mesa due to diffusion coefficient differences in various materials on a selective mask and that the diffusion coefficient of the Al and Ga material is larger than that of the In material, resulting in a large deviation of the (Al+Ga)/In composition ratio from "1" at the mesa side portions thereby adversely affecting the reliability of the structure. It is also thought that the composition ratio deviation has a good correlation with protrusions in the current blocking layer that are formed at the mesa side portions and that, due to the diffusion of the material on the selective mask at the mesa side portions during the growth, the protrusions result from a faster growth of the material at the mesa side portions than at the flat portion.

Thus, it has been envisaged by the inventor that, in order to suppress the stress caused by the lattice mismatching at the mesa side portions, the re-evaporation of material on the selective mask may be enhanced so that the current blocking layer does not protrude at the mesa side portions.

For enhancing the re-evaporation of the material on the selective mask, a few different methods can be considered. A first method is one in which parameters are changed in an MOVPE growth process. Specifically, if the growth is carried out under a reduced pressure, for example, an ultra low pressure in the order of 1 torr, the reevaporation of the material which diffuses on the selective mask is enhanced and the formation of protrusions of the n-AlGaInP current blocking layer which is a buried layer at the mesa side portions are suppressed and, as a result, the stress is also reduced.

Also, if the growth is carried out at an extremely slow growth rate, for example, in the order of 0.1 μm/h, an effect similar to the above can be expected. Furthermore, a similar effect can also be attained if the growth is carried out at a growth temperature above 850° C. Thus far, the examples wherein various growth parameters are changed have been explained.

Next, as a second method for enhancing the reevaporation of the material on the select mask, it is considered that a method wherein metalorganics containing Cl or HCl are mixed in a source gas is effective. The method wherein the HCl is mixed in a source gas in order to enhance the growth selectivity has been reported by the researchers of Mitsubishi Kasei Corp. in the Journal of Crystal Growth identified above.

However, in the reported method, since it is an AlGaAs system that is subjected to a selective growth, no lattice mismatch occurs even when there is a deviation in the composition ratio of Al and Ga (strictly speaking, there is a finite lattice mismatch but the amount thereof is so small as not to give rise to a problem). Thus, in the reported method, no consideration has been given at all to the matter of deviation in the composition ratio of (Al+Ga)/In which presents a problem when the AlGaInP current blocking layer is selectively grown.

According to the present invention, a first step is to grow, sequentially above a substrate, a second cladding layer 3, an active layer 4, a first cladding layer 5 and a cap layer 6. A second step is to etch the first cladding layer 5 and the cap layer 6 respectively in mesa stripe forms. In this step, the etching is carried out to an intermediate point of the first cladding layer 5 in order to form an optical waveguide.

Then, a third step is to selectively grow a current blocking layer 7 on the first cladding layer 5 by a metalorganic vapor phase epitaxy (MOVPE) process. The materials used in this step are metalorganics and a gas in which a $PH_3$ gas together with HCl is mixed in a concentration within a range of 0.2~2 in a (HCl)/III gas ratio. A fourth step is to grow contact layers respectively on surfaces of the current blocking layer (7) and the cap layer (6).

According to the invention, when the current blocking layer is selectively grown by the MOVPE process, the reevaporation of the material on the selective mask is enhanced and, as a result, a protrusion formed in the current blocking layer at each of the mesa side surfaces can be made less than 10% of the thickness of the current blocking layer at its flat portion.

Incidentally, the fact that a square shape protrusion develops resulting from an extraordinary growth at each selective mask ends (that is, a protrusion at each mesa side portion) by itself has been known (Japanese Patent Application Kokai Publication No. Sho 63-177493).

BRIEF DESCRIPTION OF THE DRAWINGS

The above and other objects, features and advantages of the present invention will be apparent from the following description of preferred embodiments of the invention explained with reference to the accompanying drawings, in which:

FIG. 1A is a diagram showing a perspective view of a conventional semiconductor laser diode, and FIG. 1B is a diagram showing a composition ratio of (Al+Ga)/In contained in a current blocking layer in the conventional semiconductor laser diode of FIG. 1A;

FIG. 2B is a diagram showing a composition ratio of (Al+Ga)/In contained in a current blocking layer of FIG. 2A in the semiconductor laser diode of FIG. 2A; and.

PREFERRED EMBODIMENT OF THE INVENTION

Now, a preferred embodiment of the invention is explained with reference to the drawings.

Figure 2A:
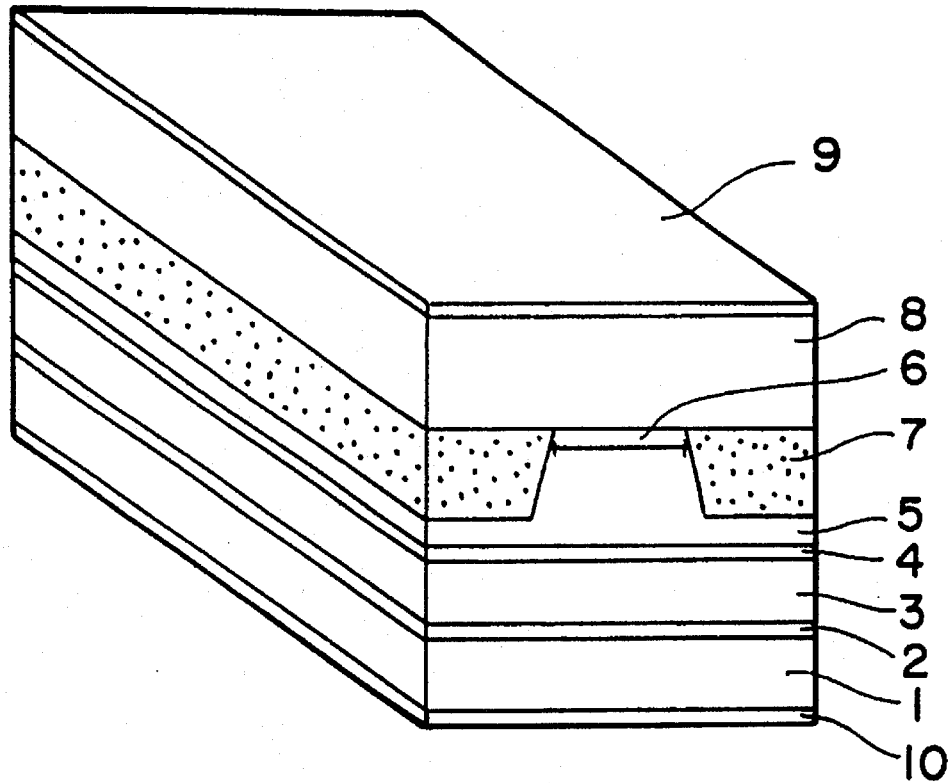
FIG. 2A is a diagram showing a perspective view of an embodiment of a semiconductor laser diode according to the invention.
Figure 2B:
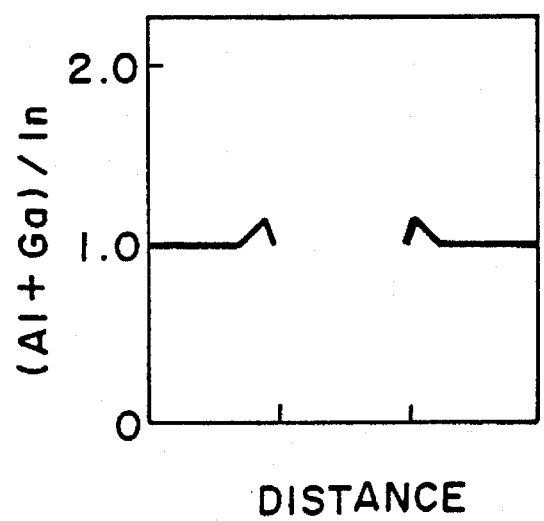

FIG. 2A shows in a perspective view a structure of a first embodiment of the invention. FIG. 2B shows a composition ratio of (Al+Ga)/In contained in a current blocking layer. In an AlGaInP material system, when (Al+Ga)/In is about "1", it is lattice-matched to GaAs of the substrate so that there is no occurrence of stress but, when (Al+Ga)/In largely deviates from "1", the lattice mismatch becomes large resulting in a large stress to the active layer.

In FIG. 2A, the numeral 1 depicts an n-GaAs substrate, 2 depicts an n-GaAs buffer layer, 3 depicts an n-AlGaInP cladding layer, 4 depicts a multiquantum well (MQW) active layer, 5 depicts a p-AlGaInP cladding layer, 6 depicts a p-GaInP cap layer, 7 depicts an n-AlGaInP current blocking layer, 8 depicts a p-GaAs contact layer, 9 depicts a p-electrode and 10 depicts an n-electrode. That is, the semiconductor laser diode of this embodiment is configured such that the MQW active layer 4 is sandwiched from above and below by the AlGaInP cladding layers 5 and 3, the upper cladding layer 5 is in a double heterostructure shaped in a mesa stripe form, and the current blocking layer 7 selectively buries mesa side and bottom surfaces of the upper cladding layer 5, wherein the feature resides in the fact that the thickness of a protrusion formed in the current blocking layer 7 at each of said mesa side surfaces is not larger than 10% of the thickness of the current blocking layer 7 at its flat portion.

Now, a method for fabricating the foregoing semiconductor laser diode is explained with reference to FIGS. 3A to 3E. This semiconductor laser diode is fabricated by carrying out an MOVPE growth process three times, including a selective MOVPE growth process which is carried out once. All of these MOVPE growth processes are reduced pressure growth processes with the pressure being 76 torr. Also, the growth temperatures are all at 700° C.

Figure 3A:
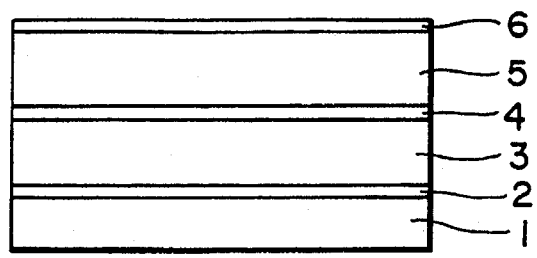
FIGS. 3A to 3E are diagrams showing sectional views of a semiconductor laser diode of the embodiment of the invention for use in explaining sequential steps of a process for the fabrication thereof.

First, as shown in FIG. 3A, the first step is to grow, sequentially above an n-GaAs substrate 1, an n-GaAs buffer layer 2, an n-AlGaInP cladding layer 3, an MQW active layer 4, a p-AlGaInP cladding layer 5 and a p-GaInP cap layer 6, thereby forming a double heterostructure including the MQW active layer 4. In this structure, the MQW active layer 4 includes 8 well layers each having a thickness of 8 nm. The oscillating wavelength is targeted to about 670 nm.

Figure 3B:
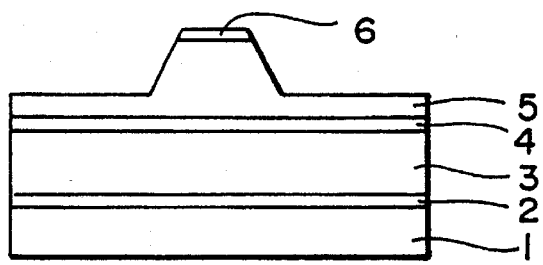

Next, a mask pattern of a stripe shape is formed on the cap layer 6 by a photolithography process. This mask uses a silicon nitride ($SiN_x$) film deposited by a plasma-assisted CVD process. With this mask used as shown in FIG. 3B, the p-AlGaInP cladding layer 5 and the cap layer 6 are etched into mesa stripe forms. This etching is a wet etching of a sulfuric acid type and, for forming an optical waveguide, is stopped at an intermediate point to the cladding layer 5 as seen in FIG. 3B.

Figure 3C:
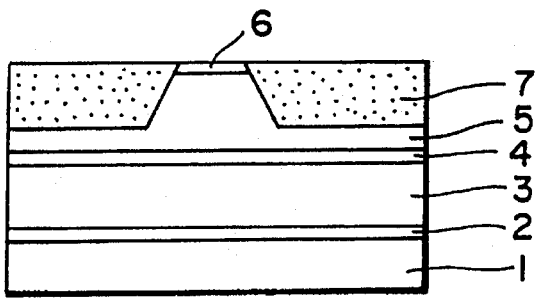

Then, by using the above mask also as a selective growth mask, the n-AlGaInP current blocking layer 7 is selectively grown as shown in FIG. 3C. At this time, the mixed crystal ratio is $(Al_{0.85}Ga_{0.15})_{0.5}In_{0.5}P$ and the n-AlGaInP is transparent to the oscillation light, and it is so designed that the laser becomes a real refractive index guide. The materials used for this selective growth are metalorganics of TMAl, TEGa, TMIn, and a gas in which a $PH_3$ gas and a HCl gas are mixed. In this case, the concentration of HCl is "1" in a mole ratio of (HCl)/(III gas).

According to the experimental result obtained by the inventor, the concentration of HCl in the mixed gas used in the selective growth of the above n-AlGaInP current blocking layer 7 is most suitable in a range from "0.2" to "2" in the mole notation. It has been confirmed that, when the concentration is below that range, the composition ratio deviation at mesa side portions becomes somewhat large and, when the concentration is conversely above that range, there appears a gradual surface morphology deterioration of the n-AlGaInP current blocking layer 7 which is due to excess HCl.

According to the embodiment of the invention, when the MOVPE selective growth is carried out using the metalorganic and the mixed gas containing HCl in the mole ratio of "1", the protrusions formed at the mesa side portions are small as shown in FIGS. 2A and 3C, thereby enabling the buried growth of the n-AlGaInP current blocking layer 7 in which the composition ratio deviation is small.

Figure 3D:
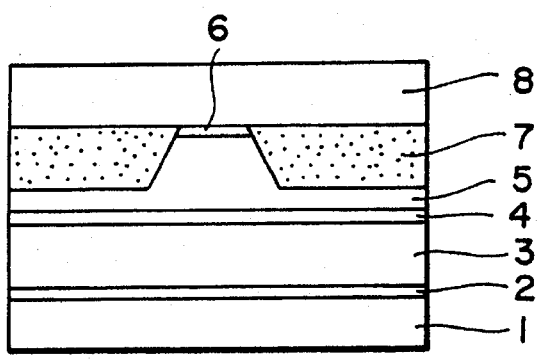
Figure 3E:
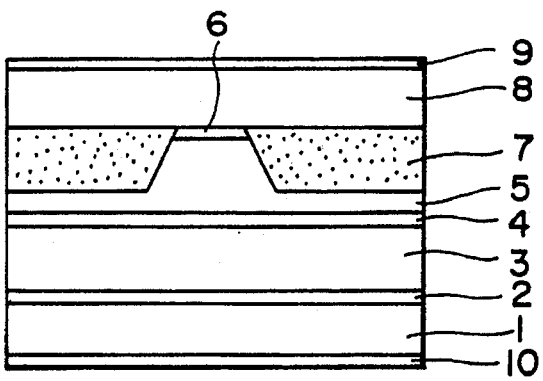

Next, the selective mask described above is removed, and the p-GaAs contact layer 8 is grown to a predetermined thickness by a third MOVPE growth as shown in FIG. 3D. Finally, as shown in FIG. 3E, the p-electrode 9 and the n-electrode 10 are formed respectively on an upper surface of the contact layer 8 and a bottom surface of the substrate 1. That is, first a Ti/Pt/Au electrode is vacuum-deposited on the contact layer 8 and heat-treated whereby the electrode 9 is formed, after which an upper surface of the substrate 1 is polished to some extent while the p-electrode 9 is being protected, and then an Au/Ge/Ni electrode is vacuum-deposited on the substrate 1 and heat-treated whereby the n-electrode 10 is formed. In this way, the fabrication of the semiconductor laser diode of this embodiment is completed.

In this embodiment, by mixing a small amount of HCl gas in the source gas used during the selective growth of the current blocking layer 7, it is made possible to enhance the re-evaporation of the material on the selective mask and to reduce the supplying of the material to the mask ends from the selective mask. Thus, as shown in FIG. 2B, the thickness of the protrusions formed at the mesa side portions of the n-AlGaInP current blocking layer 7 is suppressed to a thickness less than 5% of the thickness of the n-AlGaInP current blocking layer 7 at its flat portion. Also, the composition ratio of (Al+Ga)/In in the n-AlGaInP current blocking layer 7 is "1.05" and, when this value is compared with "1.5" in the conventional example, it is noted that the suppression is quite significant.

In view of the above, the stress to the MQW active layer 4 is significantly reduced. Thus, according to the embodiment of the invention, by suppressing the protrusions of the current blocking layer 7 at the mesa side portions to below 5%, it has been confirmed that the composition ratio deviation in the current blocking layer 7 at the mesa side portions can be suppressed to below "1.05".

The semiconductor laser diode of the embodiment of the invention and a conventional semiconductor laser diode which has been fabricated by selective growth without HCl being added are compared by subjecting them to an electrical testing under the conditions of 50° C. and 3 mW. The test results confirmed that, whereas in the conventional semiconductor laser diode a number of sudden deteriorations have developed in several hundred hours, the semiconductor laser diode of the embodiment of the invention has shown no deteriorations and has stably operated for 3000 hours. The measurement of the composition has been carried out by EDX.

In the above described embodiment, the concentration of HCl contained in the mixed gas used in the selective growth of the n-AlGaInP current blocking layer 7 is "1" in the mole notation. However, it is to be noted that, as long as this is within a range from "0.2" to "2", the thickness of the protrusions at the mesa side portions can be suppressed to a thickness less than 10% of the thickness of the n-AlGaInP current blocking layer 7 at its flat portion.

Also, in the described embodiment, the AlGaInP visible light semiconductor laser is configured such that it is buried in the n-AlGaInP current blocking layer 7. However, the invention is not limited to that configuration since, for example, the structure may well be such that AlInP is included as the current blocking layer 7 or that GaInP is included in the active layer 4, or such that a 0.98–1.02 μm band laser which uses InGaAs for an active layer is buried in the current blocking layer containing GaInP, AlGaInP or AlInP.

According to the invention, since the thickness of the protrusions in the current blocking layer at the mesa side portions of the semiconductor laser diode is less than 10% of the thickness of the current blocking layer at its flat portion, it is possible to suppress the stress to be caused by the lattice mismatch at the mesa side portions, resulting in the enhancement of the reliability of the semiconductor laser diode.

Furthermore, where as, in the conventional method of fabrication as disclosed in the earlier identified Japanese patent application Kokai publication, it is so arranged that, in order to reduce the protrusions in the current blocking layer, the stencil layer is first formed on the uppermost surface of the mesa forming region and then the stencil layer thus formed is removed by etching thereby removing a stacked layer grown on the surface of the mesa region so as to flatten this surface, the method according to the invention requires lesser number of steps to the extent that it does not require the formation and the removal of the stencil layer.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor laser diode, the method comprising the steps of:

a first step of growing, sequentially above a substrate, a second cladding layer, an active layer, a first cladding layer and a cap layer;

a second step of etching said first cladding layer and said cap layer respectively in mesa stripe forms;

a third step of selectively growing a current blocking layer on said first cladding layer by a metalorganic vapor phase epitaxy process, using a gas in which HCl is mixed in a concentration within a range of 0.2–2 in a (HCl)/(III gas) ratio; and a fourth step of growing contact layers respectively on surfaces of said current blocking layer and said cap layer.

2. The method for fabricating a semiconductor laser diode according to claim 1, in which said active layer contains one of GaInP and AlGaInP, and said current blocking layer contains one of AlGaInP and AlInP.

3. The method for fabricating a semiconductor laser diode according to claim 1, in which said active layer contains InGaAs, and said current blocking layer contains one of GaInP, AlGaInP and AlInP.

4. The method for fabricating a semiconductor laser diode according to claim 1, in which, in said step of selectively growing the current blocking layer, metalorganics of TMAl, TEGa, TMIn, and a gas in which a $PH_3$ gas and a HCl gas are mixed are used as source materials.

* * * * *